United States Patent
Liu

(10) Patent No.: US 6,848,068 B1
(45) Date of Patent: Jan. 25, 2005

(54) SOFT CODING OF MULTIPLE DEVICE IDS FOR IEEE COMPLIANT JTAG DEVICES

(75) Inventor: Zhiwu Liu, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 225 days.

(21) Appl. No.: 09/589,919

(22) Filed: Jun. 7, 2000

(51) Int. Cl.[7] .............................................. G01R 31/28
(52) U.S. Cl. ..................... 714/733; 714/30; 714/727; 716/4
(58) Field of Search ........................... 716/4, 1; 714/30, 714/727, 733; 712/38; 365/174

(56) References Cited

U.S. PATENT DOCUMENTS

| | | | | |
|---|---|---|---|---|
| 5,283,872 A | * | 2/1994 | Ohnishi ....................... 710/311 |
| 5,467,304 A | * | 11/1995 | Uchida et al. .............. 365/174 |
| 5,708,773 A | * | 1/1998 | Jeppesen et al. ............. 714/30 |
| 5,727,207 A | * | 3/1998 | Gates et al. ..................... 713/1 |
| 5,822,334 A | * | 10/1998 | Whittaker et al. .......... 714/763 |
| 5,828,824 A | * | 10/1998 | Swoboda ...................... 714/25 |
| 5,862,152 A | * | 1/1999 | Handly et al. .............. 714/727 |
| 5,983,379 A | * | 11/1999 | Warren ........................ 714/727 |
| 6,073,254 A | * | 6/2000 | Whetsel ........................ 714/30 |
| 6,115,763 A | * | 9/2000 | Douskey et al. ............. 710/72 |
| 6,195,732 B1 | * | 2/2001 | Adams et al. ............... 711/156 |
| 6,195,774 B1 | * | 2/2001 | Jacobson ..................... 714/725 |
| 6,308,311 B1 | * | 10/2001 | Carmichael et al. .......... 716/16 |
| 6,351,809 B1 | * | 2/2002 | St. Pierre et al. ............. 710/10 |
| 6,539,491 B1 | * | 3/2003 | Skergan et al. .............. 713/500 |
| 6,546,505 B1 | * | 4/2003 | Swoboda et al. ............. 714/30 |
| 6,560,734 B1 | * | 5/2003 | Whetsel ...................... 714/724 |
| 6,757,844 B1 | * | 6/2004 | Lulla et al. ................... 714/30 |
| 6,775,797 B2 | * | 8/2004 | Giaume et al. ............. 714/731 |

OTHER PUBLICATIONS

Microsoft Computer Dictionary, Third edition, 1997, Microsoft Press, pp. 137,141.*
Microsoft Computer dictionary, Third edition, 1997, Microsoft Press, pp. 137.*
IEEE Standard Test Access Port and Boundary–Scan Architecture, IEEE Std 1149.1–1990, pp. 1–127.
Supplement to IEEE Std 1149.1–1990, IEEE Standard Test Access Port and Boundary–Scan Architecture, IEEE Std 1149.1b–1994, pp. 1–68.

* cited by examiner

Primary Examiner—Stacy A. Whitmore
(74) Attorney, Agent, or Firm—Christopher P. Maiorana, PC

(57) ABSTRACT

An apparatus comprising a circuit having one or more inputs. The one or more inputs may be configured to provide a device identification (ID) of one or more different device IDs. The one or more inputs may allow implementation of the circuit with one of the one or more different device Ids.

19 Claims, 3 Drawing Sheets

US 6,848,068 B1

SOFT CODING OF MULTIPLE DEVICE IDS FOR IEEE COMPLIANT JTAG DEVICES

FIELD OF THE INVENTION

The present invention relates to a method and/or architecture for IEEE compliant JTAG devices generally and, more particularly, to a method and/or architecture for soft code for multiple device IDs for IEEE compliant JTAG devices.

BACKGROUND OF THE INVENTION

Implementing JTAG compliant devices on integrated LLW circuits (ICs) is an industry trend. The Institute of Electrical and Electronics Engineers, Inc. (IEEE) publishes a variety of specifications, such as the IEEE 1149.1 standard, published in 1990, which is hereby incorporated by reference in its entirety. An identification (ID) code is an optional instruction in the IEEE 1149.1 standard which requires a device ID (i.e., a 32-bit register). The IEEE standard 1149.1 permits implementation of a single device ID, while remaining in compliance with the JTAG specification.

Referring to FIG. 1, a block diagram of a circuit 10 illustrating a conventional JTAG system is shown. The circuit 10 comprises a logic circuit 12, a multiplexer 14 and a flip-flop 16. The multiplexer 14 has an input 18 that receives the signal from the logic circuit 12 and an input 20 that receives the signal S1. The logic circuit 12 is configured to present either a "1" or a "0" to the multiplexer 14 and cannot be changed. The logic block 12 limits functionality of the JTAG system 10.

The multiplexer 14 also has an input 22 that receives a signal SHIFT. The signal SHIFT selects either the signal received at the input 18 ("0" or "1") or the signal S1 received at the input 20 to be presented to an input 24 of the flip-flop 16. The flip-flop 16 also has a clock input 26 that receives a clock signal CLK. The flip-flop 16 has an output 28 that presents an output signal S0.

When a design is configured to target a single device, the device is assigned an unique device ID. The IEEE 1149.1 specification describes how to implement the unique device ID in a JTAG device. When one design is configured to target multiple devices, the same metal options and bond options are implemented as when targeting a single device. The metal options and bond options are generally considered hard coded.

The logic device 12 is hard coded. Additionally, the hard coded logic block 12 is implemented to provide the device ID. The hard coded device ID logic block 12 (using-metal option or bond options) can not be changed after the device 12 has been fabricated. Hard coded device IDs cannot be used in designs which provide multiple configurations using mark options (i.e., no metal options/bond options). Mark inputs can be implemented to provide a configurable device ID, while metal options/band options provide a permanent non-configurable device ID.

Typically, metal options or bond options are used to configure a single design. Conventional JTAG systems implement the same options (metal or bond) to code the ID registers. Device IDs, once hard coded into the ID registers inside JTAG devices, cannot be changed after the device has been fabricated. Conventional hard coded device IDs are not applicable for designs that provide multiple configurations using mark options (no metal options/bond options).

SUMMARY OF THE INVENTION

The present invention concerns an apparatus comprising circuit having one or more inputs. The inputs may be configured to provide a device identification (ID) of one or more different device IDs. The one or more inputs may allow implementation of the circuit with one of the one or more different device IDs.

The objects, features and advantages of the present invention include providing a method and/or architecture for soft coding of multiple device IDs for IEEE compliant JTAG devices that may (i) be configured to different device IDs after an integrated circuit (IC) has been fabricated; (ii) be transparent to users; and/or (iii) provide IEEE compliant JTAG devices.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention provides a method and/or architecture to generate IEEE compliant JTAG devices with unique device IDs that may be used for multiple configuration devices implementing mark options. Certain designs, such as FIFO applications may require IEEE compliant JTAG devices. Certain FIFO designs may not have multiple metal options/bond options configured 6L to handle ID code registers for multiple configuration devices. Therefore, mark options may be implemented in FIFO designs to provide multiple configuration devices. The multiple device IDs required for multiple configuration devices may be provided by the mark options.

Figure 1:
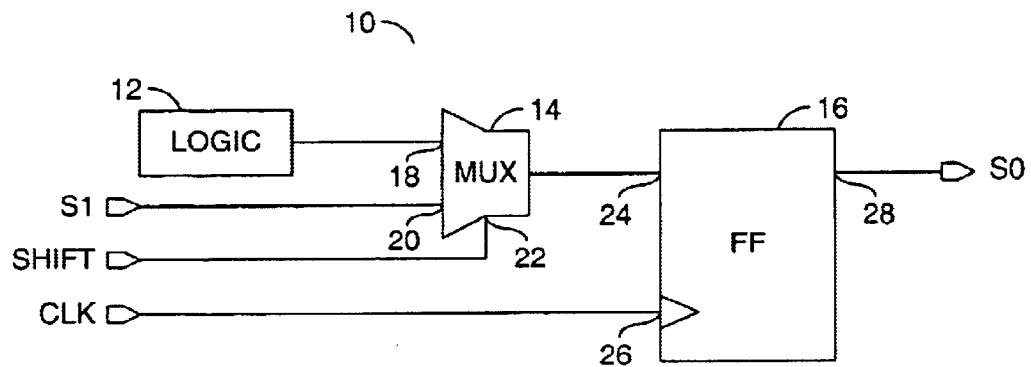
FIG. 1 is a block diagram illustrating a conventional JTAG device.
Figure 2:
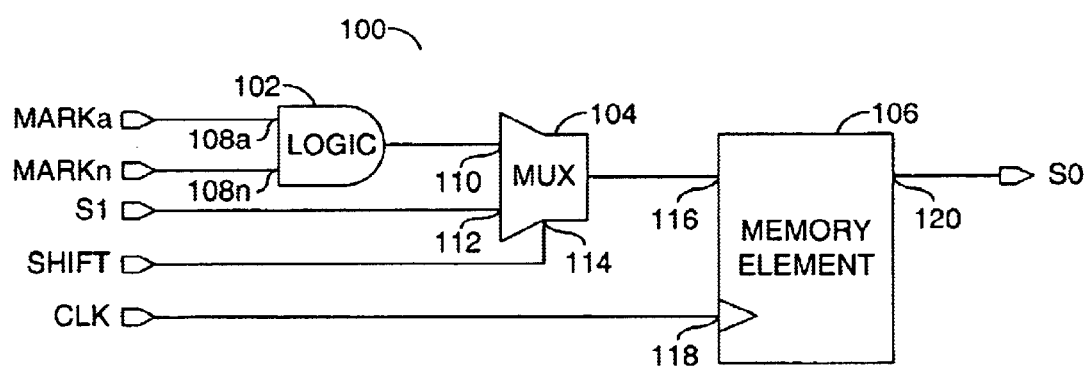
FIG. 2 is a block diagram illustrating a preferred embodiment of the present invention.

Referring to FIG. 2, a block diagram of a circuit 100 illustrating a preferred embodiment of the present invention is shown. The circuit 100 generally comprises a logic circuit 102, a multiplexer 104 and a memory element 106. In one example, the logic block 102 may be implemented as an AND gate. In another example, the memory element 106 may be implemented as a "D" type flip-flop. However, the logic block 102 and the memory element 106 may be implemented as other appropriate devices in order to meet the criteria of a particular implementation.

The logic block 102 may have a number of inputs 108a–108n that may each receive a signal (e.g., MARKa–MARKn). The signals MARKa–MARKn may be generated externally to the circuit 100. In one example, the signals MARKa–MARKn may be implemented as mark option inputs. In another example, the signals MARKa–MARKn may be implemented as configuration pins. The logic block 102 may present a signal to an input 110 of the multiplexer 104. Additionally, the multiplexer 104 may have an input 112 that may receive a signal (e.g., S1). The multiplexer 104 may also have an input 114 that may receive a signal (e.g., SHIFT). The multiplexer 104 may be configured to present a signal to an input 116 of the memory element 106. The signal SHIFT may select either the signal received at the input 110 or the signal received at the input 112 to be presented to the memory element 106. The signal SHIFT may control the multiplexer 104. The memory element 106 may have an input 118 that may receive a clock signal (e.g., CLK). The memory element 106 may have an output 120 that may present an output signal (e.g., S0). The circuit 100 may allow a single device to have multiple device IDs while implemented in an IEEE compliant JTAG device.

The external mark options MARKa–MARKn may be used to soft code device IDs. The soft code device IDs may allow a single device to be configured with a number of device IDs. The soft code device IDs may be transparent to customers, while still retaining IEEE 1149.1 compliance in the JTAG specification. The IEEE standard 1149.1 was published in 1990, and is hereby incorporated by reference in its entirety. The following TABLE 1 illustrates soft coding of different mark options (e.g., MARKa–MARKn) for the multiple device IDs:

TABLE 1

| MARKa | MARKn | Device | Device ID |
| --- | --- | --- | --- |
| GND | GND | 5 M FIFO | 0C402069 |
| VDD | VDD | 1 M FIFO | 0C401069 |
| VDD | GND | ¼ M FIFO | 0C400069 |

For example, a FIFO may have two mark option pins (e.g., MARKa and MARKn) for configuring the FIFO. The mark pins MARKa and MARKn may allow the FIFO to implement a number of different device configurations/types. The input pins MARKa and MARKn may be implemented to soft code device IDs as shown in the following TABLE 2:

TABLE 2

| MARKa | MARKn | Device | Device ID |
| --- | --- | --- | --- |
| 0 | 0 | 5 M FIFO | 0C402069 |
| 1 | 1 | 1 M FIFO | 0C401069 |
| 1 | 0 | ¼ M FIFO | 0C400069 |

Soft coded device IDs can cooperate with mark options and enable a single device to have multiple device IDs. The circuit 100 may allow the mark options MARKa–MARKn to be transparent to customers. Additionally, the circuit 100 may allow JTAG devices (e.g., the circuit 100) to remain IEEE compliant.

Figure 3:
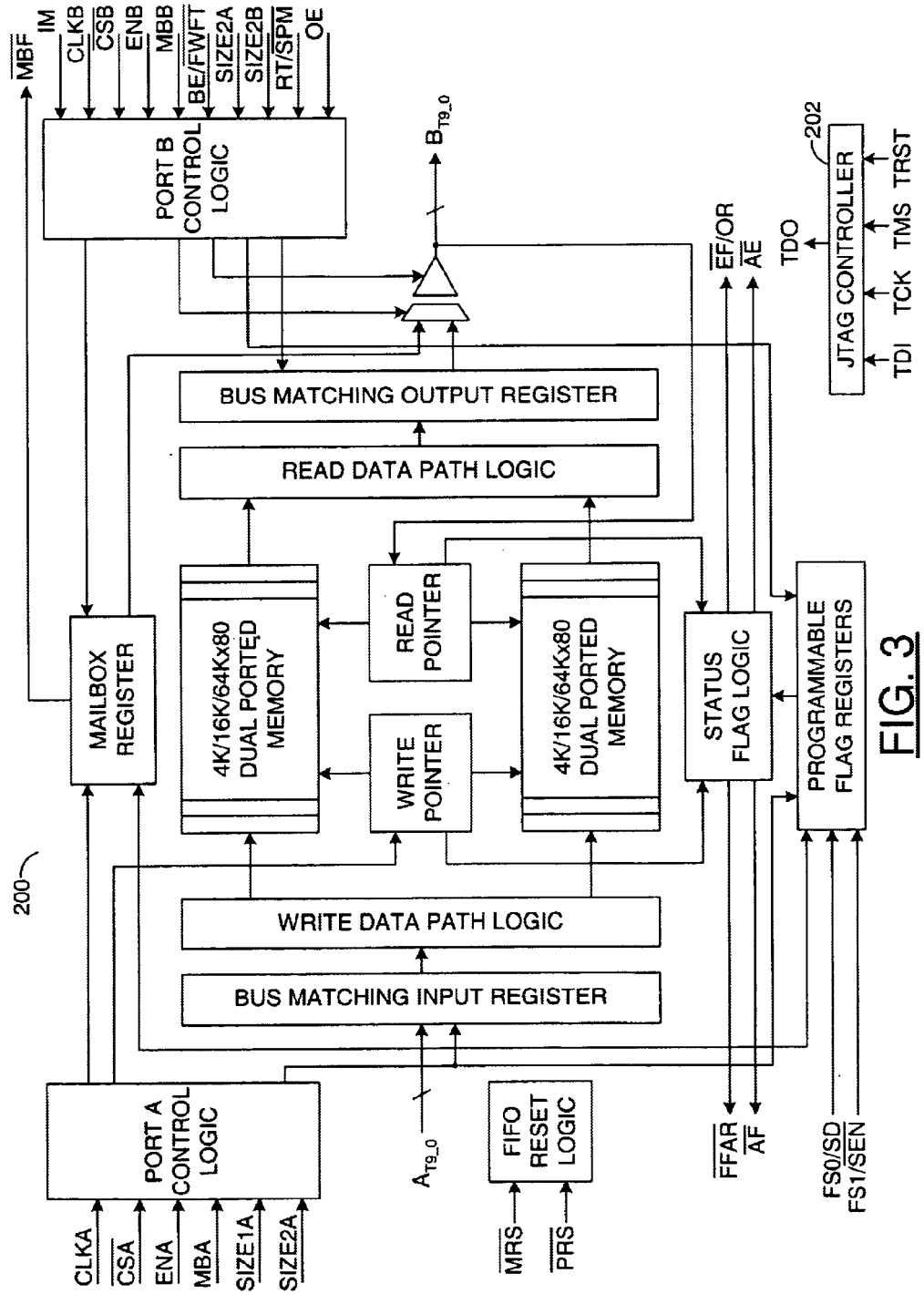
FIG. 3 is a detailed block diagram illustrating an implementation of the present invention in a FIFO.

Referring to FIG. 3, an example implementation circuit (or system) 200 of the present invention is shown. The circuit 200 may be implemented as a FIFO memory. The FIFO 200 generally comprises a controller 202. The controller 202 may be similar to the circuit 100. In one example, the controller 202 may be implemented as a JTAG controller. However, the controller 202 may be implemented as another appropriate device in order to meet the criteria of a particular implementation.

The controller 202 may control a configuration (e.g., device ID) of the FIFO 200. The controller 202 may receive a number of signals (e.g., TDI, TCK, TMS and TRST). In one example, each of the signals test data in (TDI), test clock (TCK), test mode select (TMS) and test reset (TRST) may be received from dedicated input pin. In another example, each of the signals TDI, TCK, TMS and TRST may be received from a multi-level input pin. Additionally, the controller 202 may receive a number of mark inputs (to be described in connection with FIG. 4). The controller 202 may generate a signal (e.g., test data out TDO). The signal TDO may indicate a device ID of the FIFO 200. The controller 202 may present a particular device ID (e.g., the signal TDO) in response to the signals TDI, TCK, TMS and TRST.

Figure 4:
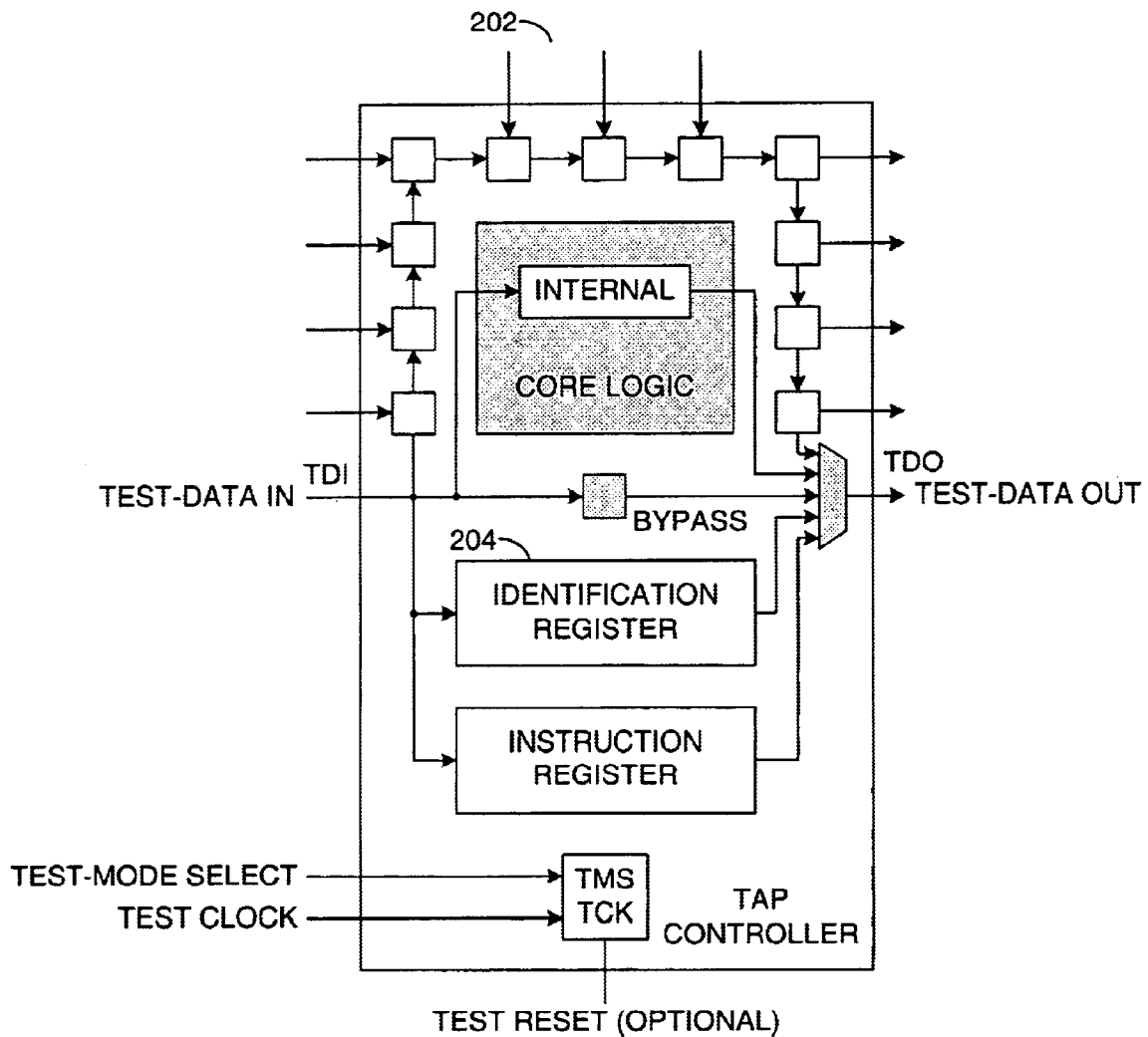
FIG. 4 is a detailed block diagram illustrating an implementation of the present invention in a JTAG device.

Referring to FIG. 4, a detailed block diagram of the controller 202 is shown. The controller 202 may have a number of mark input pins (not shown). The mark input pins may allow configuration for a device ID of a particular circuit. Additionally, the mark inputs may be transparent to a user. The controller 202 generally comprises a register 204. The register 204 may be implemented as an identification register. The register 204 may capture bits of data that may identify an ID code of a particular device. Once the ID of the device is captured, the ID code may be shifted out of the register 204 via the pin TDO. The JTAG controller 202 may allow implementation of multiple IDs of a particular device.

The circuit 100 may allow a device to have multiple device IDs. The multiple device IDs may be provided by a number of mark options. The circuit 100 may enable a single physical device to be configured to one of a number of different devices. The multiple configurations may be provided by the mark pins. The circuit 100 may soft code a device ID register and allow a JTAG device to remain compliant with the IEEE standard.

The mark pins may allow the single device to fulfill different customer requirements. The circuit 100 may be configured is to different device IDs (e.g., different configurations) after an initial IC fabrication. The circuit 100 may be transparent to customers. The circuit 100 may allow JTAG devices to remain IEEE compliant. The circuit 100 may be implemented to soft code device IDs inside a JTAG device implementing mark options. Additionally, the circuit 100 may be implemented to configured a single device with multiple device IDs. However, the circuit 100 may require significant design/test overhead.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a plurality of configuration pins configured to receive a plurality of configuration signals generated external to said apparatus;
    an input pin for data; and
    a circuit comprising:
        a first logic gate configured to generate a first identification signal from said configuration signals;
        a first multiplexer having (i) a first input directly connected to said first logic gate to multiplex said first identification signal to a first multiplexer output, (ii) a second input for receiving a serial signal and (iii) a third input for receiving a control signal that controls selection between said first input and said second input; and
        a shift register comprising a plurality of memory elements, wherein (i) said shift register is couplable to said input pin for shifting in said data and (ii) a first of said memory elements has a first input directly connected to said first multiplexer output such that said first identification signal forms a first portion of a device identification for said apparatus.

2. The apparatus according to claim 1, wherein said configuration signals are user variable.

3. The apparatus according to claim 1, wherein said circuit comprises a JTAG compliant controller.

4. The apparatus according to claim 1, wherein each value of said device identification identifies a unique configuration of said circuit.

5. The apparatus according to claim 4, wherein said device identification determines a storage capacity of said circuit.

6. The apparatus according to claim 1, wherein said circuit further comprises:
   a second logic gate configured to generate a second identification signal from said configuration signals and;
   a second multiplexer directly connected to said second logic gate to multiplex said second identification signal to a second multiplexer output, wherein a second of said memory elements has a second input directly connected to said second multiplexer output such that said second identification signal forms a second portion of said device identification.

7. The apparatus according to claim 6, wherein said second multiplexer is directly connected to a first memory output of said first memory element.

8. The apparatus according to claim 1, wherein said circuit further comprises a FIFO memory.

9. The apparatus according to claim 1, wherein said configuration signals comprise mark options.

10. The apparatus according to claim 1, wherein said circuit comprises a JTAG device compliant with the IEEE standard 1149.1.

11. The apparatus according to claim 1, further rising an output multiplexer configured to multiplex said device identification from said shift register to an output pin.

12. An apparatus comprising:
   means for receiving a plurality of configuration signals generated external to said apparatus;
   an input pin for data;
   means for generating a first identification signal from said configuration signals;
   means for multiplexing between (i) said first identification signal from said means for generating and (ii) a serial signal to a first output in response to a control signal; and
   means for storing a plurality of bits (i) couplable to said input pin for shifting in said data, wherein (ii) a first of said means for storing has a first input directly connected to said first output such that said first identification signal forms a portion of a device identification for said apparatus.

13. A method for selecting a device identification for an apparatus, comprising the steps of:
   (A) receiving a plurality of configuration signals generated external to said apparatus at a plurality of configuration pins;
   (B) generating a first identification signal by performing a logic operation on said configuration signals;
   (C) multiplexing in response to a control signal between (i) said first identification signal and (ii) a serial signal to a first memory element of a plurality of memory elements in a shift register couplable to an input pin for shifting in data; and
   (D) storing said first identification signal in said first memory element such that said first identification signal forms a first portion of said device identification.

14. The method according to claim 13, wherein said configuration signals are user variable.

15. The method according to claim 13, wherein each value of said device identification identifies a unique configuration of said apparatus.

16. The method according to claim 13, wherein said device identification determines a storage capacity of said apparatus.

17. The method according to claim 13, wherein said configuration signals comprise mark options.

18. The method according to claim 13, wherein said apparatus is a JTAG device compliant with the IEEE standard 1149.1.

19. The method according to claim 13, further comprising the step of:
   multiplexing said device identification from said shift register to an output pin.

* * * * *